United States Patent [19]

Yarman

[11] Patent Number: 4,604,593
[45] Date of Patent: Aug. 5, 1986

[54] π-SECTION DIGITAL PHASE SHIFTER APPARATUS

[75] Inventor: Binboga S. Yarman, Istanbul, Turkey

[73] Assignee: The United States of America as represented by the Secretary of the Air Force, Washington, D.C.

[21] Appl. No.: 767,455

[22] Filed: Aug. 20, 1985

[51] Int. Cl.[4] .................. H03H 7/20; H01P 1/185
[52] U.S. Cl. .................... 333/139; 333/23; 333/161; 333/164; 307/320
[58] Field of Search .............. 333/23, 28 R, 138–140, 333/156–164, 246; 307/320; 332/30 R, 30 V

[56] References Cited

U.S. PATENT DOCUMENTS

| 3,196,368 | 7/1965 | Potter | 332/30 V |
| 3,278,866 | 10/1966 | Bose | 333/17 R |
| 3,718,873 | 2/1973 | Garver | 333/164 |
| 3,745,487 | 7/1973 | Milard et al. | 333/164 |
| 4,001,734 | 1/1977 | Burns | 333/164 |
| 4,423,393 | 12/1983 | Freitag et al. | 333/164 |

OTHER PUBLICATIONS

"Broad-Band Diode Phase Shifters," by R. V. Garver in IEEE Transactions on Microwave Theory and Techniques, vol. MTT-20, No. 5, May 1972, pp. 314–323.

"Simplified Switched Line Phase Shifter," by A. Schwarzmann, in DEP Symposium on MIC's May 1971.

Primary Examiner—Marvin L. Nussbaum
Attorney, Agent, or Firm—Donald J. Singer; William Stepanishen

[57] ABSTRACT

An extra high frequency π-section digital phase shifter apparatus having a diode connected between two identical parallel shunt circuits. The parallel shunt circuits connect to the series inductor/diode circuit at both the input and output and each parallel shunt circuit has inductor connected in parallel with a capacitor and a diode to provide balanced insertion loss at each diode switching state. When the diodes of the circuit are in the forward-biased state they act as closed short circuit switches. When the diodes are reverse-biased, the inductance in the shunt circuit resonates with the diode capacitance to provide a short circuit path to the RF signal at the center frequency of the RF signal at the desired phase.

8 Claims, 3 Drawing Figures

π-SECTION DIGITAL PHASE SHIFTER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a phase shifter apparatus, and in particular to a π-section digital phase apparatus.

In modern high frequency radar and communication systems, the antenna pattern must be moved at very rapid rates. This scanning is normally achieved in array antennas through the use of a matrix of small radiator elements whose radiation phases are systematically and electronically varied. The necessary phase gradients across the antenna are usually generated in discrete steps by a plurality of such electronic phase shifter elements.

In the prior art, a major handicap in the past phase shifter elements has been in the inability to exactly reproduce the diodes upon which the characteristics of the diode phase shifter elements are significantly dependent. However, this problem has been essentially resolved by semiconductor manufacturers, so that phase shifter development attention is directed to the improvement of the phase shifter elements themselves. The design of the present phase shifter element permits is beneficially to be physically smaller than the conventional elements of the loaded transmission line type.

In the military market, there is an increasing demand to fabricate monolithic digital phase shifters at extra high frequencies (EHF) with low insertion loss. However, as the frequency increases, the insertion loss requirements become very difficult to meet. Recent advances in the art have produced a 4-Bit monolithic digital phase shifter, which incorporates conventional circuit configurations, but only achieved only about 5 dB insertion loss at 10 GH which is excessively large for most military applications. Clearly there is a need for new techniques or configurations to design digital monolithic phase shifters with low insertion loss at high frequencies (X-Band and above). In the present invention, a π-section digital phase shifter apparatus which is suitable for extra high frequency (EHF) applications, offers low insertion loss and excellent phase tracking capability, is presented.

The present π-section digital phase shifter apparatus is also suitable for monolithic implementation and as such will have low cost so that it may be used in large military antenna arrays. Since the π-section digital phase shifter apparatus has all the outstanding merits of the conventional π-section design but with a different distribution of the elements and values, it will therefore, find wide practical application in the system design where conventional and even π-section designs are not feasable to use from technical and economical stands.

SUMMARY OF THE INVENTION

The present invention utilizes a pair of shunt parallel resonant circuits which comprise an inductor in parallel with a capacitor that is in series with a diode. The resonant parallel circuit is arranged in a π configuration at the input and output to a series circuit which comprises a single diode connected between the input and output terminals. The π-section digital phase shifter apparatus exhibits easy practical implementation with balanced insertion loss at each diode switching state. Therefore, it will find wide application in the military communication, system design.

It is one object of the present invention, therefore, to provide an improved extra high frequency π-section digital phase shifter apparatus.

It is another object of the invention to provide an improved extra high frequency π-section digital phase shifter apparatus wherein a pair of parallel resonant circuits comprise an inductor in parallel with a capacitor which is in series with a diode.

It is yet another object of the invention to provide an improved extra high frequency π-section digital phase shifter apparatus wherein the series circuit between the input and output comprises a diode with a pair of shunt circuits each comprised of an inductor and a capacitor in series with a diode at the input and output to the series diode circuit combination.

It is still another object of the invention to provide an improved extra high frequency π-section digital phase shifter apparatus wherein the insertion loss of the phase shift circuit is balance for each diode conducting state.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
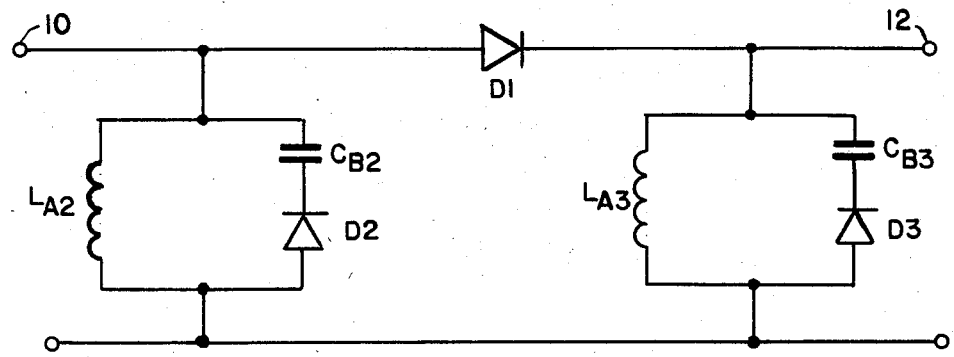
FIG. 1 is a schematic diagram of the extra high frequency π-section digital phase shifter apparatus according to the present invention.

Turning now to FIG. 1, there is shown a schematic diagram of the extra high frequency π-section digital phase shifter apparatus according to a preferred embodiment of the present invention. The extra high frequency π-section digital phase shifter apparatus is comprised of a series a diode D1 which are connected between the input terminal 10 and the output terminal 12 of the digital phase shift circuit. The anode of the diode D1 is connected to the input terminal 10, the cathode of diode D1 is connected to the output terminal 12. A first parallel circuit which comprises an inductor $L_{A2}$ in parallel with the series combination of capacitor $C_{B2}$ and diode D2, is connected between the input terminal 10 and a common input/output line (a common ground). A second parallel circuit which is identical to the first parallel circuit in components and elements values, is connected between the output terminal 12 and the common input/output line (a common ground). The second parallel circuit utilizes an inductor $L_{A3}$, capacitor $C_{A3}$ and diode D3 in the parallel/series configuration which is shown in FIG. 1. For all practical considerations, all the diodes D1 through D3 of the digital phase shifter apparatus are assumed to be identical and mesa-pin diodes may be utilized in shunt configuration.

The diode D1 may have the identical electric and physical characteristics of the diodes D2 and D3 and it may be a planar pin diode in series configuration. This practical restriction can be easily removed when considering the particular desired characteristics of the phase shifting operation.

Figure 2:
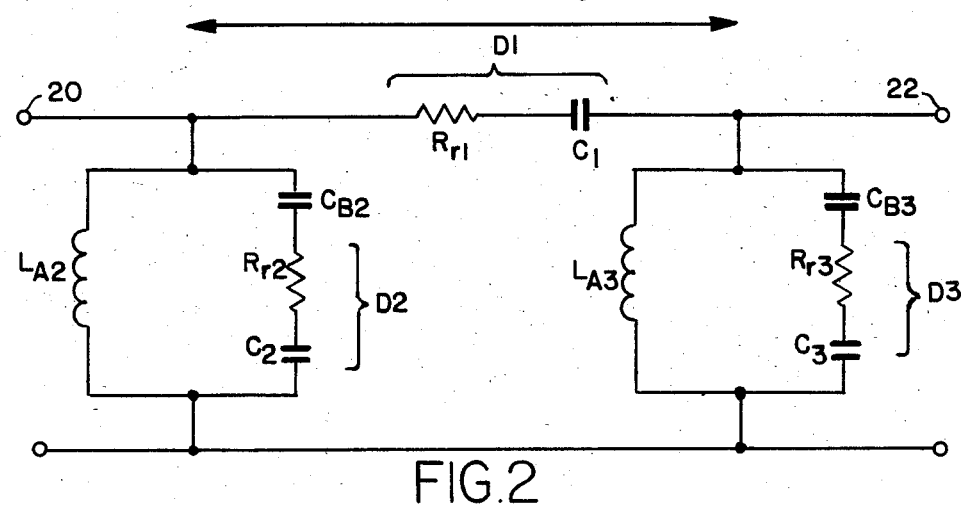
FIG. 2 is a schematic diagram of the extra high frequency π-section digital phase shifter apparatus in which the diodes are reverse-biased, and, FIG. 3 is a schematic diagram of the extra high frequency π-section digital phase shifter apparatus in which the diodes are forward-biased.
Figure 3:
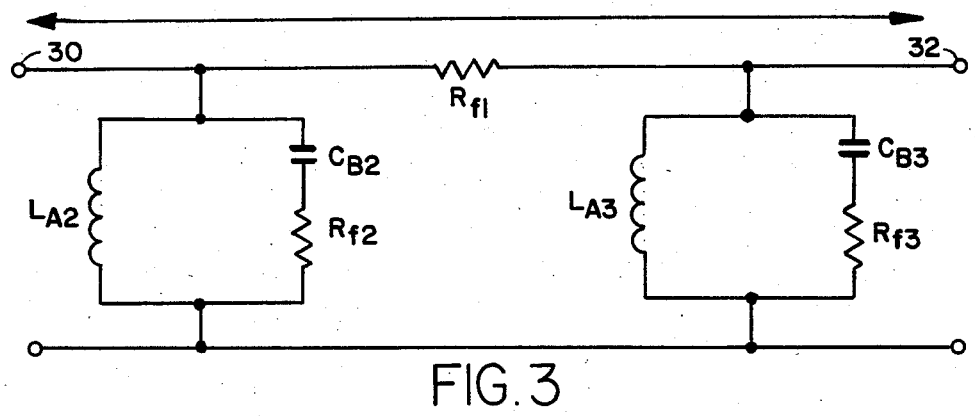

The operation of the extra high frequency π-section digital phase shifter apparatus will be better understood when the following description is taken in conjunction with FIGS. 2 and 3. In FIG. 2 there is shown a schematic diagram of the extra high frequency π-section digital phase shifter apparatus in which the diodes D1 through D3 of FIG. 1 are reverse-biased (BIT-IN-State). When the diode D1 is reverse-biased, the series circuit from the input 20 to the output 22 is comprised of the reverse resistance, $R_{r1}$ of the diode D1 and the diode capacitance, $C_1$.

When the diodes D1, D2 and D3 are reverse-biased (BIT-IN-State), they act as capacitors $C_1$, $C_2$, $C_3$ with a small series resistances $R_{r1}$, $R_{r2}$, and $R_{r3}$. In this state, reactive circuit elements which comprise the capacitor $C_1$, $C_2$, $C_3$, $C_{B2}$, $C_{B3}$ and the inductors $L_{A2}$, $L_{A3}$ are computed in such a way that the desired phase shift $\Delta\phi$ is achieved with no transmission loss at the center frequency $f_o$ of the passband.

Referring now to FIG. 3, there is shown the equivalent schematic diagram of the extra high frequency π-section digital phase shifter apparatus wherein the diodes D1, D2 and D3 of FIG. 1 are forward-biased (BIT-OUT-State). When the diode D1 is forward-biased, the series circuit from the input 30 to the output 32 comprises the forward resistance, $R_{f1}$ of the diode D1. When the diodes D1, D2 and D3 are forward-biased, (BIT-OUT-State), they act as closed short circuit switches with a small forward resistance $R_{f1}$, $R_{f2}$, $R_{f3}$. In the shunt circuit branches, both parallel circuit reduce to the equivalent circuit of an inductor in parallel with the series combination of a capacitor in series with a small forward resistance. For examples, the first parallel shunt circuit which in FIG. 1 includes diode D2, reduces in FIG. 3 to the inductor $L_{A2}$ in parallel with the series combination of capacitor $C_{B2}$ and the forward resistance $R_{f2}$ (which is the forward-biased circuit equivalent of diode D2). The second parallel shunt circuit which involves diode D3, also reduces to an inductor $L_{A3}$ in parallel with the series combination of capacitor $C_{B3}$ and the forward resistance $R_{f3}$ (which is the forward-biased circuit equivalent of diode D3). Each parallel shunt circuit in this mode (the forward-biased, BIT-OUT-State) becomes a tank circuits which resonates at the center frequency $f_o$. The relationship between the inductive and capacitive elements in this mode are defined by the following equation:

$$(2\pi f_o)^2 = \frac{1}{L_A C_B}$$

providing a perfect transmission for the RF signal. Thus, the π-section digital phase shifter is perfectly matched at the center frequency $f_o$ for both BIT-IN and BIT-OUT states. Therefore in contrast to many conventional designs, there is no intrinsic mismatch loss associated with the extra high frequency π-section purposed digital phase shifter apparatus at the center frequency, $f_o$. However, some losses due to the practical implementation of the circuit elements are inevitable. The element values of the π-section digital phase shifter can be computed using the following equations which are shown in Table 1:

TABLE 1

$$\mu = \tan\left(\frac{\pi}{2} - \Delta\phi\right) \quad (1)$$

$$L = \mu + \sqrt{\mu^2 + 1} \quad (2)$$

$$C = \frac{1 + L^2}{2L} \quad (3)$$

$$C_B = \frac{1 + \sqrt{1 + 4CL}}{2L} \quad (4)$$

$$L_A = \frac{1}{C_B} \quad (5)$$

where $\Delta\phi$, $0 < \Delta\phi < 180°$, is the specified phase shift. Element values the capacitors $C_1$, $C_2$, $C_3$, $C_{B2}$, $C_{B3}$ and the inductors $L_{A2}$, $L_{A3}$ are all normalized with respect to center frequency $f_o$ and the normalization number of the resistor $R_o$ ($R_o$ may be chosen as 50Ω).

The extra high frequency π-section digital phase shifter apparatus which is shown in FIG. 1 may be implemented either by discrete components or as a monolithic chip. If discrete component approach is taken, the diodes D1, D2 and D3 should be chosen such that they provide the desired reversed capacitance value C which is computed by Equation (3) with low reverse ($R_r$) and forward ($R_f$) resistances. It should be understood that the capacitance value C of Equation (3) is equal the value of capacitors $C_1$, $C_2$, $C_3$ of FIG. 2. The tuning capacitor $C_B$ could be any kind of chipped-lumped ceramic capacitor which is commercially available on the market. The shunt inductors $L_A$ in the parallel arms can be realized as bond wires or as microstrip transmission lines. It should also be understood that the inductors $L_A$ and the capacitors $C_B$ include additonal numerical subscripts to relate and identify these components with their respective diode in FIGS. 2 and 3. The interconnections between the diodes and the circuit elements may be achieved through the use of wide ribbons. If the monolithic circuit approach is taken, any kind of available substrates e.g: Si, GaAs, GaInAs, InP, etc. may be used to realize the diodes and the rest of the circuit elements. The shunt diodes D2 and D3 of FIG. 1 may be fabricated as mesa-pin diodes with low loss by employing the device technology which is currently available in the field and the diode D1 may be implemented using conventional planar-pin diode fabrication techniques. The capacitance $C_B$ can be fabricated as a layer capacitance and the shunt inductors $L_A$ can be approximated as an open or shunt stub transmission lines on microstrips. The DC biasing of the diodes is conventional. However, it should be pointed out that the capacitor $C_B$ may also be used as a DC blocking capacitor to separate the diodes D1, D2 and D3 with respect to the DC biasing.

Although the invention has been described with reference to a particular embodiment, it will be understood to those skilled in the art that the invention is capable of a variety of alternative embodiments within the spirit and scope of the appended claims.

What is claimed is:

1. An extra high frequency π-section digital phase shifter apparatus comprising in combination:

a first diode means, the anode of said first diode means forming an input terminal for an RF signal, the cathode of said second diode means forming an output terminal, said first diode means having a first and second state, a first shunt circuit comprising a first inductor means in parallel with first capacitor means which is in series with a second diode means, one end of said first inductor means connected to one end of said first capacitor means to form a first junction, said first junction connected to said input terminal, the other end of said first inductor means connected to one end of said second diode means to form a second junction, said second junction connected to ground, said second diode means having a first and second state, and, a second shunt circuit comprising a second inductor means in parallel with second capacitor means which is in series with a third diode means, one end of said second inductor means connected to one end of said second capacitor means to form a third junction, said third junction connected to said output terminal, the other end of said second inductor means connected to one end of said third diode means to form a fourth junction, said fourth junction connected to ground, said third diode means having a first and second state.

2. An extra high frequency $\pi$-section digital phase shifter apparatus as described in claim 1 wherein said first, second and third diodes means are identical.

3. An extra high frequency $\pi$-section digital phase shifter apparatus as described in claim 2 wherein said first state of said first, second and third diode means is the forward-biased state and said secnd state of said first, second and third doide means is the reverse-biased state.

4. An extra high frequency $\pi$-section digital phase shifter apparatus as described in claim 3 wherein the insertion loss of said digital phase shifter apparatus at both said first and second state of said first, second and third diode means is perfectly matched.

5. An extra high frequency $\pi$-section digital phase shifter apparatus as described in claim 3 wherein said first, second and third diode means in said first state each respectively comprise a small forward resistance, $R_f$.

6. An extra high frequency $\pi$-section digital phase shifter apparatus as described in claim 3 wherein said first, second and third diode means in said second state each respectively comprise a capacitance, $C_D$ and a reverse resistance, $R_r$.

7. An extra high frequency $\pi$-section digital phase shifter apparatus as described in claim 5 wherein said series circuit between said input and output terminal comprises a first forward resistor $R_{f1}$, said first shunt circuit comprises said first inductor means in parallel with the series combination of said first capacitor means and a second forward resistor $R_{f2}$, and, said second shunt circuit comprises said second inductor means in parallel with the series combination of said second capacitor means and a third forward resistor $R_{f3}$.

8. An extra high frequency $\pi$-section digital phase shifter apparatus as described in claim 6 wherein when said first, second and third diode means are in said second state said series circuit between said input and output terminal comprises a first capacitor $C_1$ in series with a first reverse resistor $R_{r1}$, said first shunt circuit comprises said first inductor means in parallel with the series combination of said first capacitor means, a second reverse resistor $R_{r2}$, and a second capacitor $C_{D2}$, and, said second shunt circuit comprises said second inductor means in parallel with the series combination of said second capacitor means, a third reverse resistor $R_{r3}$ and a third capacitor $C_{D3}$.

* * * * *